United States Patent
Savithri

(10) Patent No.: US 7,109,738 B2
(45) Date of Patent: Sep. 19, 2006

(54) METHOD FOR MODELING INDUCTIVE EFFECTS ON CIRCUIT PERFORMANCE

(75) Inventor: Nagaraj Narasimh Savithri, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/994,850

(22) Filed: Nov. 22, 2004

(65) Prior Publication Data

US 2006/0109021 A1    May 25, 2006

(51) Int. Cl.
*G01R 31/26* (2006.01)

(52) U.S. Cl. ..................... 324/765; 324/763

(58) Field of Classification Search ............ 324/763; 337/57; 438/18; 257/48; 714/733, 734
See application file for complete search history.

(56) References Cited

U.S. PATENT DOCUMENTS

| 5,504,434 | A | * | 4/1996 | Schepis et al. ............. 324/719 |
| 6,166,607 | A | * | 12/2000 | Schoellkopf ................. 331/57 |
| 6,731,129 | B1 | * | 5/2004 | Belluomini et al. ........ 324/765 |
| 6,925,404 | B1 | * | 8/2005 | Corr ........................... 702/117 |
| 2005/0166100 | A1 | * | 7/2005 | Heaton et al. .............. 714/100 |

* cited by examiner

*Primary Examiner*—Ernest Karlsen
*Assistant Examiner*—Arleen M. Vazquez
(74) *Attorney, Agent, or Firm*—Robert D. Marshall, Jr.; W. James Brady; Frederick J. Telecky, Jr.

(57) ABSTRACT

A method for testing a partially fabricated wafer is provided that comprises the following steps: providing a device under test (DUT) and three reference oscillators overlying a substrate of the wafer; measuring the frequencies of the reference oscillators as influenced by transistor characteristics, intra structure parasitics, resistive, capacitive and inductive parasitics; and isolating the inductive parasitics by the appropriate comparisons between the reference oscillators.

3 Claims, 6 Drawing Sheets

METHOD FOR MODELING INDUCTIVE EFFECTS ON CIRCUIT PERFORMANCE

TECHNICAL FIELD OF INVENTION

The present invention relates to integrated circuit fabrication, and specifically to structures and methods for electrical testing and/or for process monitoring and/or parasitic extraction accuracy monitoring and/or building statistical interconnect models based on silicon measurements.

BACKGROUND OF THE INVENTION

A critical part of semiconductor manufacturing and design is the testing of integrated circuits. Before the functionality tests at the end of processing, additional testing for process monitoring is also useful. Testing for process monitoring uses special test structures which are not part of the integrated circuit's functionality. Process monitoring helps to detect problems that may cause reliability problems in the field, helps to optimize the process for maximum yield, and helps to catch any process deviations before too much work-in-process is wasted.

Typical electrical test structures for in-process testing are long series-connected chains of similar elements (to test for excessive resistance or open circuits). The test structure will also include two or more "probe pads," which are flat metal surface that electrical connection can be made to them in the test lab. These test structures are manufactured at the same time as the functional circuitry, using the same process steps, but are specially designed to test particular process parameters. (For example, to test for specific contact resistance a chain of thousands of series-connected contacts might be created.) A large variety of test structures are used by process engineers to test various process stages and device portions.

A "wafer" is a flat disk of semiconductor material on which integrated circuits are made by micro-fabrication techniques. After fabrication is complete, the wafer will be separated into rectangular "dice," each of which is the electronics portion of one integrated circuit. The dice will be packaged to provide the end-product integrated circuits. Typically one wafer will provide dozens or hundreds of dice.

When the dice are separated, some of the wafer surface between them is wasted. This space is known as "scribelines," since the dice were formerly separated by scribing and fracturing; now that diamond sawing has replaced scribing, these spaces are also known as "saw streets."

Test structures are placed within the scribelines of the wafer (and in other places), typically once or more per photolithographic field. Typical scribeline test structures are individually connected to corresponding probe pads, also located in the scribelines. Since the area within the scribelines is densely occupied, the size and number of probe pads is critical. However, probe pad size has not scaled as fast as other process steps, and the space available within the scribelines is very limited. Placing multiple test structures and probe pads for those test structures within this limited area becomes difficult in many processes, and limits the testing of the wafer fabrication process. Limits to the testing capability lead to less reliable integrated circuits.

Scribeline widths are typically less than a tenth of a millimeter. Probe pads are typically made just small enough to fit within the scribeline. These dimensions can be expected to change over time, in dependence on wafer fabrication and separation technologies; but the key point is that each probe pad occupies a very significant fraction of the limited available scribeline area.

Since each probe pad nearly fills the width of a scribeline, the layout of test structures in the scribelines is often somewhat one-dimensional. That is, a test structure in the scribelines can be allowed to take up nearly the entire width of the scribeline, and extended along the scribeline as far as necessary.

Some space in the corners of the dice themselves is typically also allocated for test patterns, but again the available area is limited. Typically several to several tens of test structures can fit into each corner of a die.

Some space for test structures is also available along the edge of the wafer, where the grid of square or rectangular dice meets the unusable width of the rounded edge. While these spaces are relatively large, they are far from the important central areas of the wafer. Thus test structures in the edge-of-wafer corners cannot provide sufficiently close monitoring of process variation, including spatial variation across the wafer.

One basic tool for process monitoring is the use of pilot wafers. Some manufacturers will start several pilot or dummy wafers for each wafer that will produce actual chips. While some use of pilot wafers will always be common (e.g. at the head of each lot), every pilot wafer start takes the place of a wafer full of salable chips. Thus to the extent that sufficient process monitoring can be done using on-chip test and monitoring structures, this is greatly preferable to use of pilot wafers. Dummy wafers, on the other hand, are used to ensure that equipment has stabilized, e.g. when a bulk furnace is being ramped up or when a wet processing station has been refilled. Use of such dummy wafers is not motivated by process monitoring needs, and hence would not appear to be subject to trade-off against on-wafer test structures.

U.S. Pat. publication 20020047724, entitled "Multi-state test structures and methods," describes a selection capability that radically increases the number of test structures per probe pad. By adding a test selector to the test structure, multiple test structures are multiplexed to one (or more) probe pads. Selection of which test structure is to be accessed from a given probe pad is preferably performed entirely by control of the voltage applied across the probe pads. In one class of embodiments, the applied voltage directly determines which test structure will be accessed. In another class of embodiments, modulation of the applied voltage controls sequential logic that selects one of multiple test structures for access.

In the past, circuit delay has been due mostly to transistors. Today, the dominant source of delay in circuits such as ASICs and microprocessors is metal interconnect. FIG. 1 is a schematic diagram of a prior art charge-based capacitance measurement (CBCM) structure for measuring parasitic capacitance. A paper entitled "An On-Chip, Attofarad Interconnect Charge-Based Capacitance Measurement (CBCM) Technique," Proc. of IEDM 1996, pp. 69–72, discloses an improved test structure for performing CBCM that included an on-chip signal generator and an entirely new measurement scheme as well. The resolution limit of the methodology is estimated to be 0.01 fF, hence making it more than adequate for characterizing parasitic interconnect capacitances.

In this paper, a test structure is disclosed that comprises a pair of NMOS and PMOS transistors connected in a "pseudo" inverter configuration two form two inverters 100, 101. Inverter 100 is a reference inverter used to achieve the highest resolution. Inverter 100 is identical to inverter 101 in every manner except that it does not include the target capacitance to be characterized. Inverter 101 is connected to the target device that is to be measured. For example, in FIG. 1 the target device consists of level 2 metal line 111 and level 1 metal line 112 that form an intersection at 110. This structure is used to measure the resulting interconnect capacitance between the two lines. The reference inverter is connected to metal 1 line 113 that is the same configuration as line 112, but does not contain the metal 1 to metal 2 overlap capacitance that is to be measured.

FIG. 2 is a timing diagram illustrating non-overlapping clock signals used by the prior art CBCM structure of FIG. 1. The V1 and V2 signals of FIG. 1 consist of two non-overlapping signals shown in FIG. 2. These signals can be either generated off-chip or on chip. The purpose of these non-overlapping waveforms is to ensure that only one of the two transistors in each test structure inverter is conducting current at any given time. Thus, short-circuit current from Vdd to ground is eliminated. When the PMOS transistor turns on, it will draw charge from Vdd to charge up the target interconnect capacitance.

This amount of charge will then be subsequently discharged through the NMOS transistor into ground. An ammeter can be placed at the source of the PMOSFET (or, alternatively at the source of the NMOSFET) to measure this charging current. The actual waveform of this charging current is of no consequence; only its DC or average current value needs to be measured. DC current can be easily obtained from any modern current meter. The difference between the two DC current values in FIG. 1 is used to extract the target interconnect capacitance as shown by equations 1 and 2 below.

$$I - I_{ref} = I_{net} \quad (1)$$

$$C = I_{net}/V_{dd} * F \quad (2)$$

CBCM can be used in conjunction with simulation at early process development stages to provide designers with accurate parasitic interconnect capacitances; including metal to substrate, interwire, and interlayer capacitances, as discussed in a paper entitled "Investigation of Interconnect Capacitance using Charge-Based Capacitance Measurement (CBCM) Technique and 3-Dimensional Simulation", IEEE JSSC, pp. 449–453, March 1998. However, this paper teaches that several test structures must be utilized to decouple vertical and horizontal capacitive components from the total capacitance.

Therefore, there is still a need in the art for a way to increase the efficiency of space usage for test structures within the scribelines of an integrated circuit process.

SUMMARY OF THE INVENTION

An apparatus is provided for testing a partially fabricated wafer using a test structure located within the scribe lines of the wafer. The test structure includes a first structure overlying a substrate and coupled to a first probe pad, such that the first structure has a first parasitic capacitance relative to the substrate. A second structure is located in proximity to the first structure, such that the first structure has a second parasitic capacitance relative to the second structure. A bias circuit is coupled to the second structure and has an input coupled to a second probe pad. The bias circuit is operable to bias the second structure in response to a select signal impressed on the second probe pad. A test signal impressed on the first probe pad is operable to provide a measure of the first parasitic capacitance when the select signal has a first value; and the test signal is operable to provide a measure of the second parasitic capacitance when the select signal has a second value.

A method for testing a partially fabricated wafer is provided that comprises the following steps:

a) providing a device under test (DUT) overlying a substrate of the wafer;

b) biasing a second structure located in proximity to the DUT to have a first electrical state such that a first equivalent test structure is formed;

c) determining a first parasitic parameter associated with the first equivalent test structure by applying a signal to the DUT while the second structure is in the first electrical state and measuring a response that is indicative of the first parameter;

d) biasing the second structure to have a second electrical state such that a second equivalent test structure is formed; and e) determining a second parasitic parameter associated with the second equivalent test structure by applying a signal to the DUT while the second structure is in the second electrical state and measuring a response that is indicative of the second parameter.

Advantages of the disclosed methods and structures, in various embodiments, can include one or more of the following: more test structures can be used on a given wafer; test structures can be made larger; quicker correction of process deviations; increased efficiency of use of wafer area; increased efficiency of use of scribeline area; fewer probe pads are needed; increased yield; and increased capability for "early warning" testing increases reliability of the integrated circuits.

BRIEF DESCRIPTION OF THE DRAWINGS

The disclosed inventions will be described with reference to the accompanying drawings, which show important sample embodiments of the invention, wherein.

Corresponding numerals and symbols in the different figures refer to corresponding parts unless otherwise indicated.

DETAILED DESCRIPTION OF PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. More over, some statements may apply to some inventive features but not to others.

Figure 1:
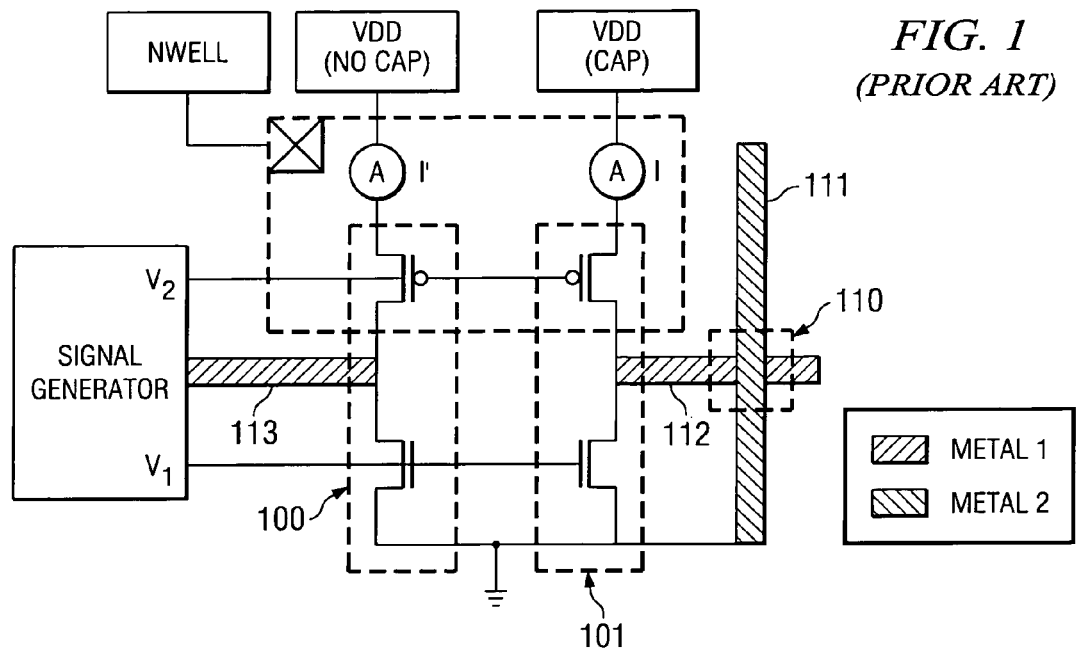
FIG. 1 is a schematic diagram of a prior art charge-based capacitance measurement (CBCM) structure for measuring parasitic capacitance.
Figure 2:
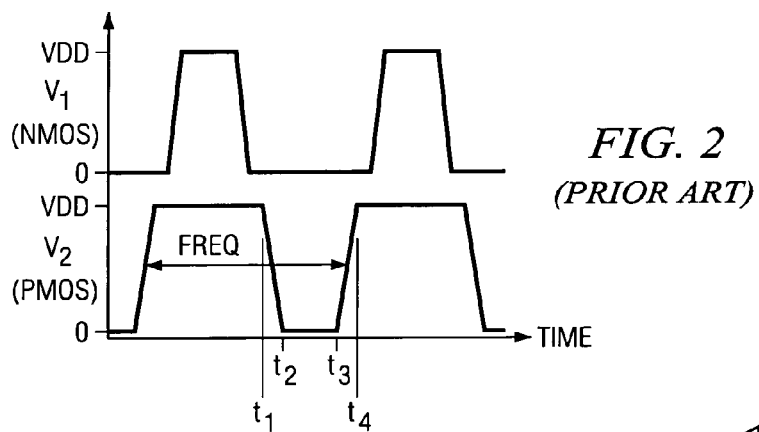
FIG. 2 is a timing diagram illustrating non-overlapping clock signals used by the prior art CBCM structure.
Figure 3:
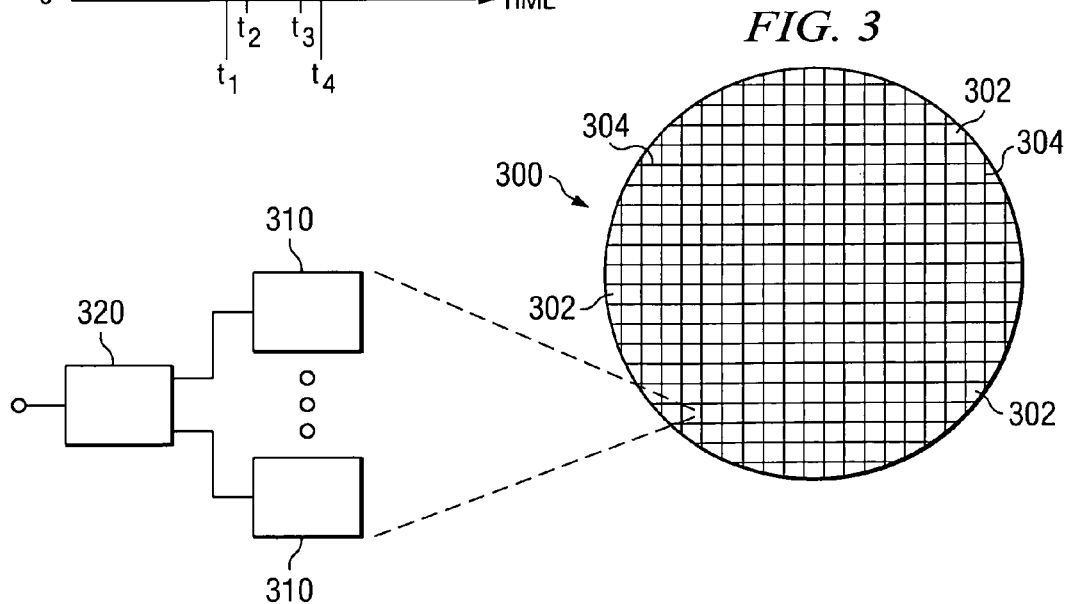
FIG. 3 is an illustration of a partially completed wafer showing the placement of individual chips and scribelines in which are located test structures according to the present invention.

FIG. 3 shows a wafer 300 on which individual chips 302 are being built. The chips 302 are divided by scribelines 304. As described below, the area of the scribelines 304 is used to place test structures 310 and test selectors 320, so that area on the wafer is used efficiently. The test selectors 320 comprise circuit elements that accept a select signal and multiplex one of several biasing signals onto the test structures depending on that input signal. In this way, a single probe pad can be used to effectively vary a test structure 310 on a wafer, thus reducing the number of structures needed to determine parasitic values associated with a three dimensional structure and thereby improving the efficiently of the testing process, as will now be described in more detail.

The test structures and test selectors are made on the wafer surface in the same way that other circuit features are produced. In the preferred embodiment, this includes the typical integrated circuit fabrication processes, such as photolithography, etches, depositions, etc. These features are placed on the wafer area that is later used for scribelines that separate the several chips on the wafer. When the chips are physically separated from one another (by sawing, breaking, etc.), the test structures and test selectors are destroyed. These test structures and test selectors are normally not connected to any circuitry on the chips themselves.

Figures 4, 6:
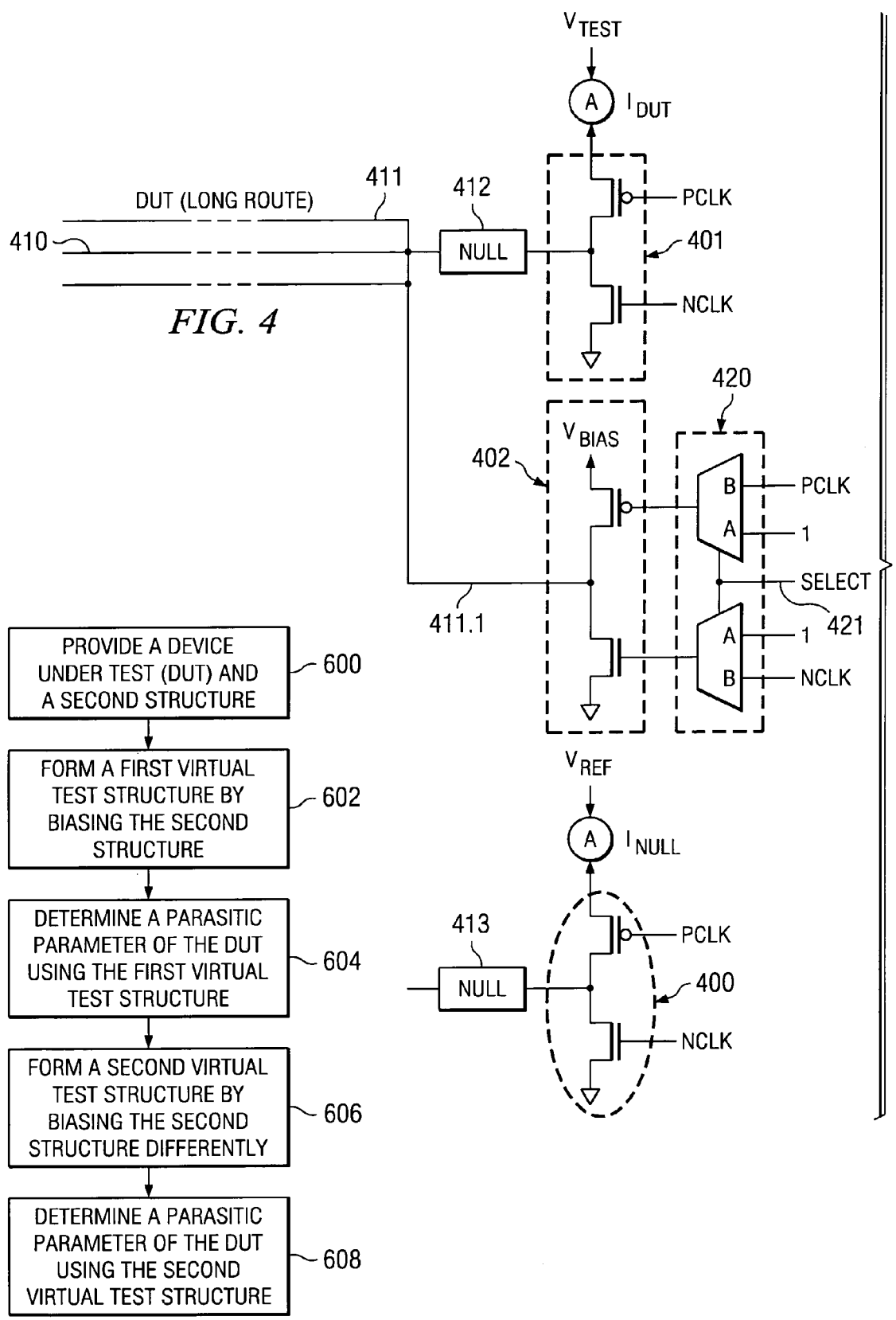
FIG. 4 is a schematic illustrating an embodiment of a CBCM test structure according to aspects of the present invention.
FIG. 6 is a flow chart of a test method using the structure of FIG. 4.

FIG. 4 is a schematic illustrating an embodiment of a CBCM test structure according to aspects of the present invention. The overall technique is similar to prior art structures; however, in this embodiment reference inverter 400 is located separately from the device under test (DUT) inverter 401. In order to achieve the highest resolution, a null line segment 413 is included with the reference inverter that is identical to null line segment 412. Null line segment 412 is a necessary connection line to the DUT line 410, but it's parasitic capacitance is not to be included as part of DUT line 410. An advantage of locating reference inverter separately from DUT inverter 401 will be discussed with reference to FIG. 8. In another embodiment of the present invention, reference inverter 400 may be co-located with DUT inverter 401.

DUT line 410 extends over the substrate of the wafer for some distance and therefore has a parasitic capacitance to the substrate. A second structure 411 is located in proximity to DUT line 410 and is fashioned as side by side tracks on either side of line 410. In another test structure, other configurations may be employed, as will be described later. Second structure 411 also has parasitic capacitive effects with DUT line 410. DUT line 410 and structure 411 are representative of parallel signal lines used for interconnect in a finished circuit. The line to substrate and line-to-line parasitic values are an important factor in the design of the finished circuit and therefore need to be monitored during fabrication of a wafer.

In order to test both parameters with only a single structure, select circuitry 420 is provided along with another inverter 402. Inverter 402 will be referred to as a bias inverter. Reference inverter 400 and test structure inverter 401 identical in every manner. Bias inverter 402 is likewise similar to inverter 401, but may be modified slightly in order to maintain similar signal characteristics between line 410 and structure 411. Selector 420 is controlled by select signal 421 and causes different bias conditions to be selected and applied to structure 411.

By biasing structure 411 to a steady voltage, such as to substrate potential, the combined parasitic capacitance of DUT line 410 to the substrate and also to structure 411 can be measured. Alternatively, another steady voltage, such as Vdd could be applied to structure 411 as a bias. In this embodiment, when select is de-asserted (a logical low signal) each multiplexer of select circuit 420 passes a logical one signal to the two gate inputs of bias inverter 402. This causes the PMOS transistor to turn off and the NMOS transistor to connect structure 411 to ground, thereby biasing the structure with a steady ground potential. The CBCM measurement is then made by applying a periodic voltage to the DUT line 410 from test inverter 401 in response to non-overlapping clock signals pclk and nclk. Test voltage $V_{test}$ is applied to a probe pad connected to inverter 401 for this purpose and a resulting DUT current flow $I_{DUT}$ is measured that is representative of the parasitic capacitance value. Similarly, a null current $I_{null}$ is measured by applying reference voltage $V_{ref}$ to a probe pad connected to null inverter 400. Null inverter 400 also is controlled by non-overlapping clock signals pclk and nclk. The parasitic capacitance is then determined using equation 3.

$$C = (I_{DUT} - I_{NULL})/V_{dd} * F \qquad (3)$$

Then, by asserting the select signal (a logical one), each multiplexer of select circuit 420 passes the non-overlapping clock signals pclk, nclk to the two gate inputs of bias inverter 402. This then causes structure 411 to be biased with a periodic voltage that has the same waveform as the periodic voltage applied to DUT line 410. Because of this, no charge will flow between DUT line 410 and structure 411 due to parasitic capacitance. Therefore, the test structure is effectively changed to form a virtual test structure that only comprises the DUT. Thus, when the CBCM measurement process is again performed, as described above, only the parasitic capacitance of DUT line 410 with reference to the substrate will be measured.

Thus, by placing two different bias signals on structure 411, two different virtual test structures are formed and two different parasitic capacitance parameters can be measured using only one physical test structure.

Figure 5:
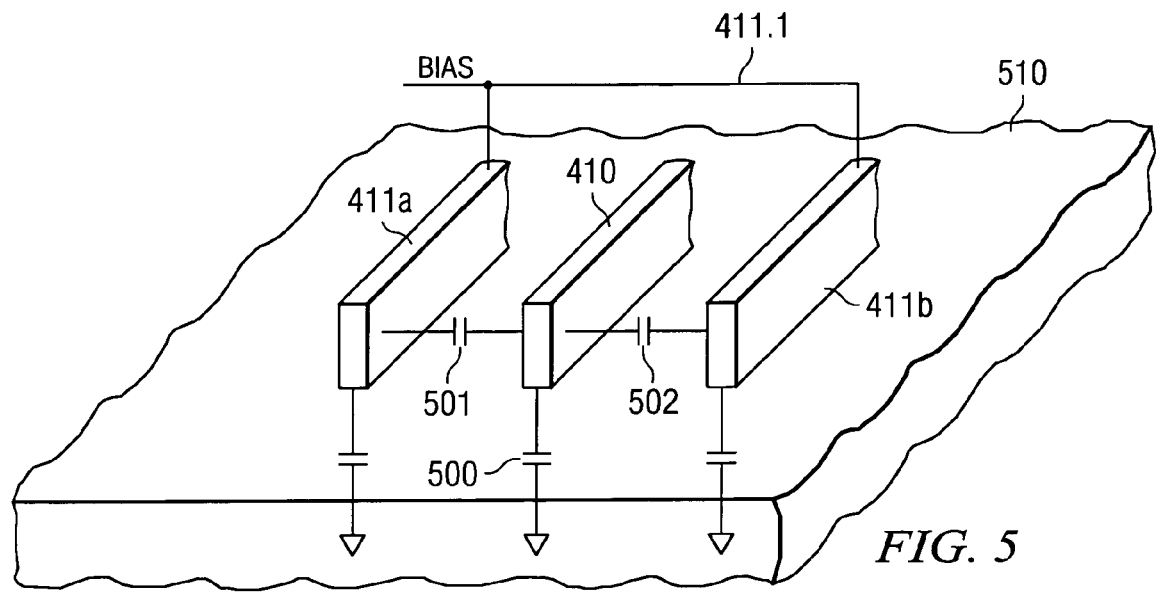
FIG. 5 is a pictorial representation of various parasitic capacitances that exists in the structure of FIG. 4.

FIG. 5 is a pictorial representation of various parasitic capacitances that exists in the structure of FIG. 4. Capacitance 500 represents a parasitic capacitance between DUT 410 and substrate 510 due to the physical proximity of DUT 410 to substrate 500. Of course, it is to be understood that capacitance 500 is a distributed capacitance along the length of DUT 410, but is shown for simplicity as a single element. After capacitive measurements are taken using the CBCM technique, generally the measured value is normalized to a capacitance/length value based on the length of DUT 410.

Parasitic capacitance 501 and 502 likewise represent distributed parasitic capacitance that occur between DUT 410 and secondary structure 411 represented by 411a, 411b due to the proximity of structure 411 to DUT 410.

By applying a first constant voltage bias signal to structure 411 via signal line 411.1, a CBCM measurement of current drawn into DUT 410 will be indicative of combined capacitance 500, 501 and 502. Advantageously, by applying a periodic bias voltage to structure 411 via 411.1 that mirrors the periodic CBCM voltage applied to DUT 410, a virtual structure is formed that effectively does not include secondary structure 411. CBCM measurement of current drawn into DUT 410 will be indicative of only capacitance 500, since no charge will flow between DUT 410 and structure 411. Thus, capacitance 501 and 502 can be deduced by subtracting the measured value of capacitance 500 from the total measured value of combined capacitance 500, 501, 502. In this embodiment, element 411a and 411b are identical and equally spaced from DUT, therefore it can further be deduced that capacitance 501 is approximately equal to capacitance 502.

FIG. 6 is a flow chart of a test method using the structure of FIG. 4. In step 600, a device under test (DUT) is provided that overlays a substrate of the wafer. A second structure located in proximity to the DUT is also provided. As discussed above, the DUT has a parasitic parameter relative to the substrate and a parasitic parameter relative to the second structure.

In step 602, a first virtual test structure is formed by biasing the second structure to have a first electrical state. This is done by connecting the second structure to the substrate, for example In step 604, a first parasitic parameter is determined by applying a signal to the DUT while the second structure is in the first electrical state and measuring a response that is indicative of the first parameter. Using the CBCM technique, measuring the current drawn into the DUT will provide a current value that is indicative of the combined capacitance of the DUT relative to the substrate and relative to the second structure.

In step 606, a second virtual test structure is formed by biasing the second structure to have a second electrical state. This is done by connecting the second structure to periodic voltage that is the same or similar to a periodic voltage applied to the DUT, for example.

In step 608, a second parasitic parameter is determined by applying a signal to the DUT while the second structure is in the second electrical state and measuring a response that is indicative of the second parameter. Using the CBCM technique, measuring the current drawn into the DUT will now provide a current value that is indicative of only the capacitance of the DUT relative to the substrate since the second structure has been virtually removed from the test structure by the periodic bias signal.

Figure 7:
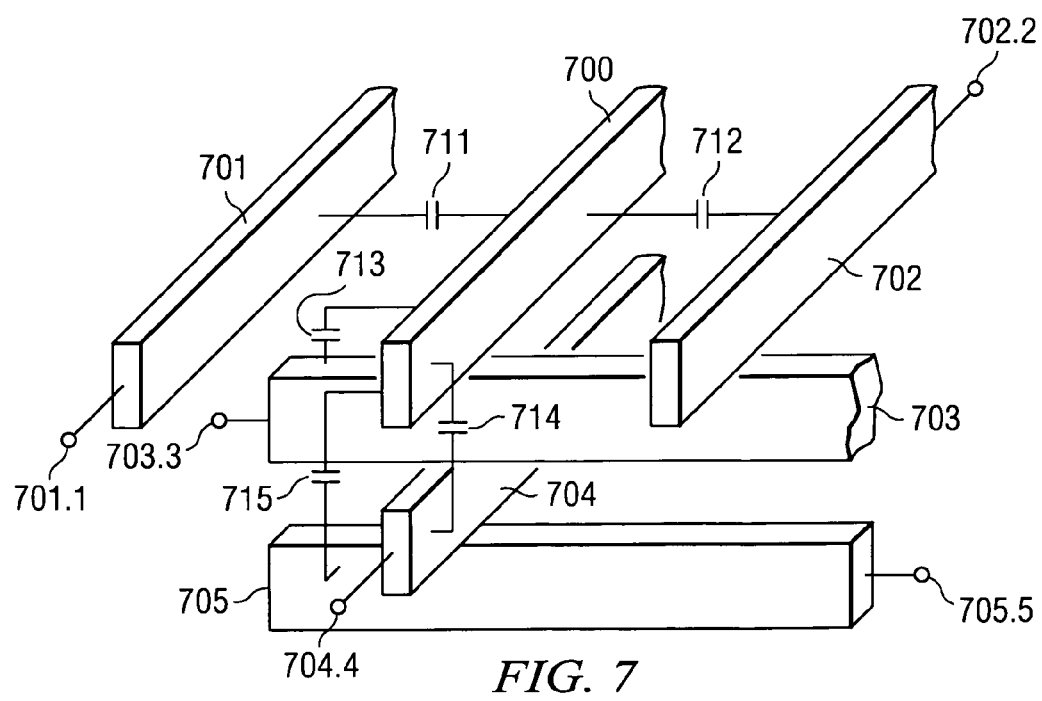
FIG. 7 is a pictorial of a more complex structure illustrating various parasitic capacitances that can be isolated using a single structure, according to aspects of the present invention.

FIG. 7 is a pictorial of a more complex structure illustrating various parasitic capacitances that can be isolated using a single structure, according to aspects of the present invention. Element 700 is the DUT and overlays a substrate, not shown for clarity. Elements 701 and 702 proximally located in parallel to DUT 700 on a same level. Element 704 is proximally located in parallel to DUT 700 on a lower level. Elements 703 and 705 are proximally located in a perpendicular arrangement on different levels. Various parasitic capacitances 711–715 exist between DUT 700 and elements 701–705 due to the close physical spacing. Advantageously, by connecting various combinations of bias voltages to elements 701–705 via respective terminals 701.1–705.5 various virtual structures can be formed. By performing a CBCM measurement on each virtual structure, the various parasitic capacitances 711–715 can be directly measured or deduced, as described previously.

Figure 8:
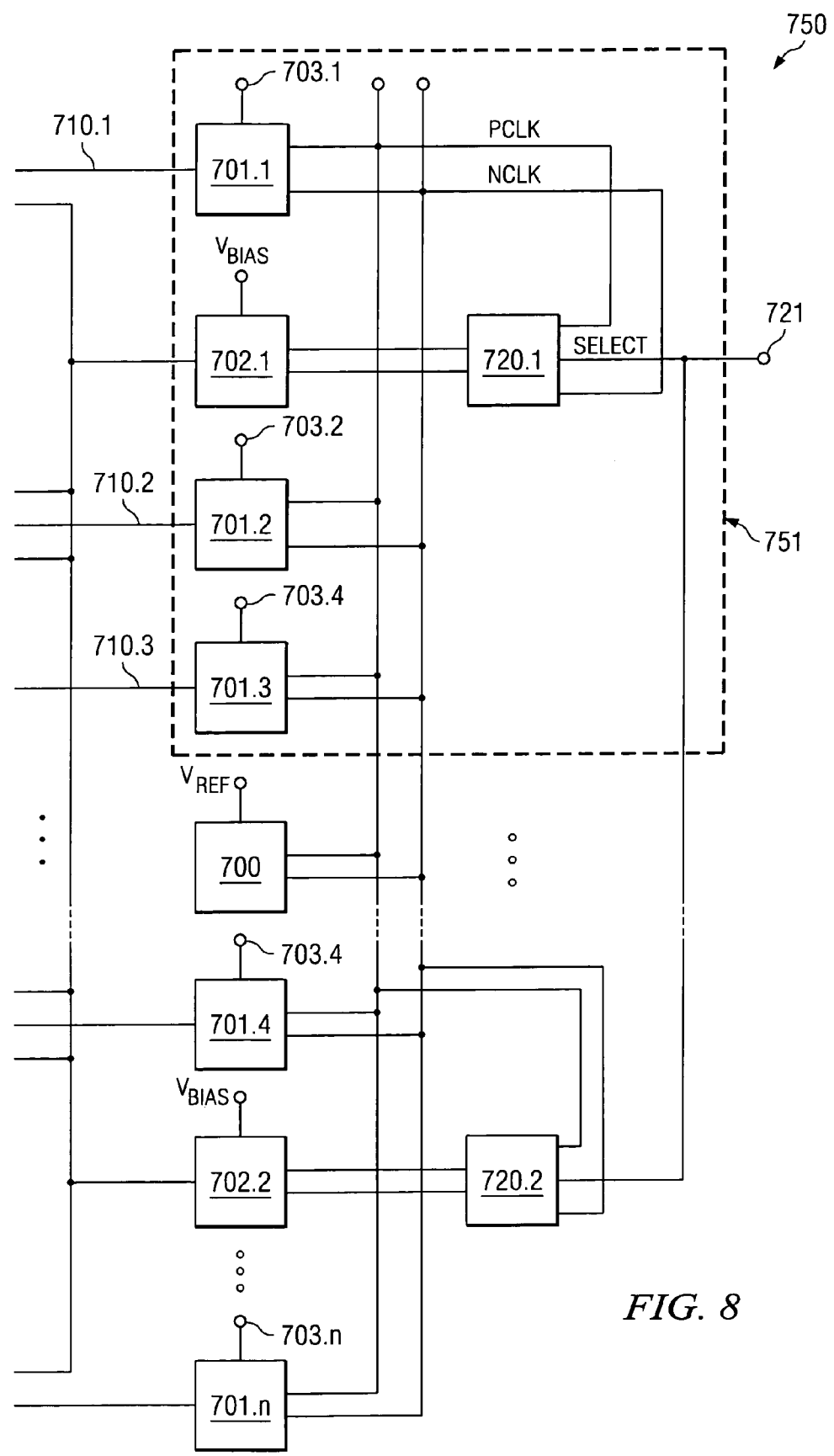
FIG. 8 is a schematic illustrating use of a common reference circuit for several CBCM measurement circuits.

FIG. 8 is a schematic of a test structure 750 that includes many DUT inverters 701.1–701.n and illustrating use of a common reference circuit 700. Referring again to FIG. 4, it was mentioned that reference circuit 400 optionally could be located separately from DUT inverter 401. The inventor of the present invention has discovered that a single reference inverter 700 can be used to improve the resolution of a number of DUT inverters 701.1–701.n, where each DUT inverter 701.x is similar to DUT inverter 401 and reference inverter 700 is similar to reference inverter 400. Non-overlapping clock signals nclk and pclk are routed to each inverter and are provided by dedicated probe pads. Each of DUT inverters 701.1–701.n is designed to be identical. Within a local region that includes all of DUT inverters 701.1–701.n, fabrication repeatability is generally good enough to insure that all of the DUT inverters will have the same electrical characteristics so that a single reference inverter is sufficient. Advantageously, this allows a smaller overall footprint for test structure 750.

Another aspect of test structure 750 is that it is divided into banks, as represented by bank 751 that each contain three or four DUT inverters, for example. In this embodiment, bank 750 has three DUT inverters 701.1–701.3 that each have a respective probe pad 703.1–703.3 for providing a test voltage $V_{test}$. Bias circuitry that includes selection circuitry 720.1 and bias inverter 702.1 provide a bias voltage to each of the three secondary structures associated with each of respective DUTs 710.1–710.3. Advantageously, a single select signal applied to probe pad 721 controls selection circuitry 720.1 and thereby controls the bias of each of the secondary structures. Note that each of the secondary structures may have a different physical configuration, or they may all be the same.

Additional banks each have another bias circuit, such a selection circuit 720.2 and bias inverter 702.2. All of the selection circuits receive a common select signal from probe 721. However, in an alternate embodiment, separate select signals may be provided on separate probe pads. This may be useful in a complex structure such as that illustrated in FIG. 7.

A representative test structure 750 may contain 20 probe pads. Two are connected to receive the non-overlapping clock signals. One is connected to receive the select signal. Another one is connected to provide $V_{bias}$ to each of the bias inverters 702.x. Another is connected to provide $V_{ref}$ to the single reference inverter 700. The remaining fifteen probe pads are connected to provide Vtest to each of fifteen DUT inverters 701.x that are organized into five banks. The twenty probe pads are arranged in a linear manner and the entire test structure fits within a scribeline region. Larger test structures can be configured in a similar manner, for example having forty probe pads.

Figure 9:
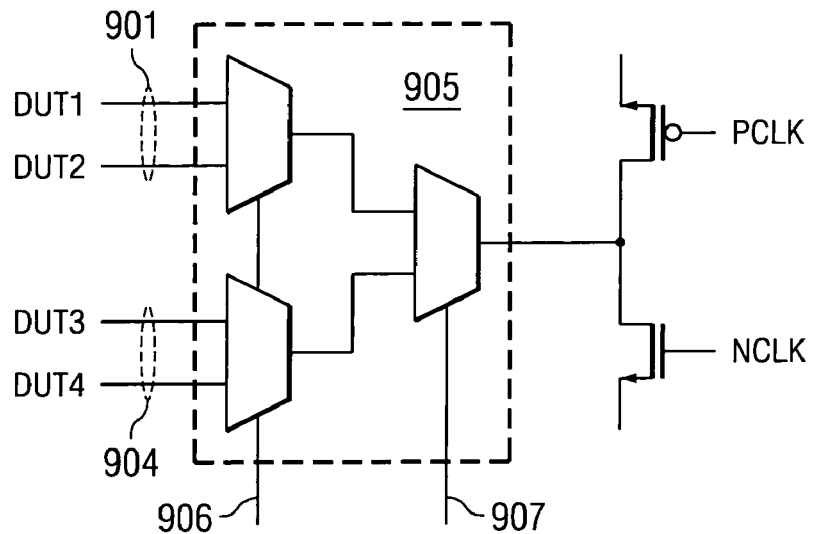
FIG. 9 is a schematic illustrating the use of demultiplexing circuits to expand the number of DUTs.

FIG. 9 shows a test structure wherein a plurality of DUT's 901 through 904 are connected to demultiplexer 905. Control lines 906 and 907 may be used to select the DUT to be tested. The depth of the demultiplexer chain may be extended to increase the number of DUTs that may be selected for testing.

In another embodiment of the invention, multiple ring oscillators may be used both as a DUT and as a reference, and the circuit's inductance may be derived by measuring the frequency of the oscillators.

Figure 10:
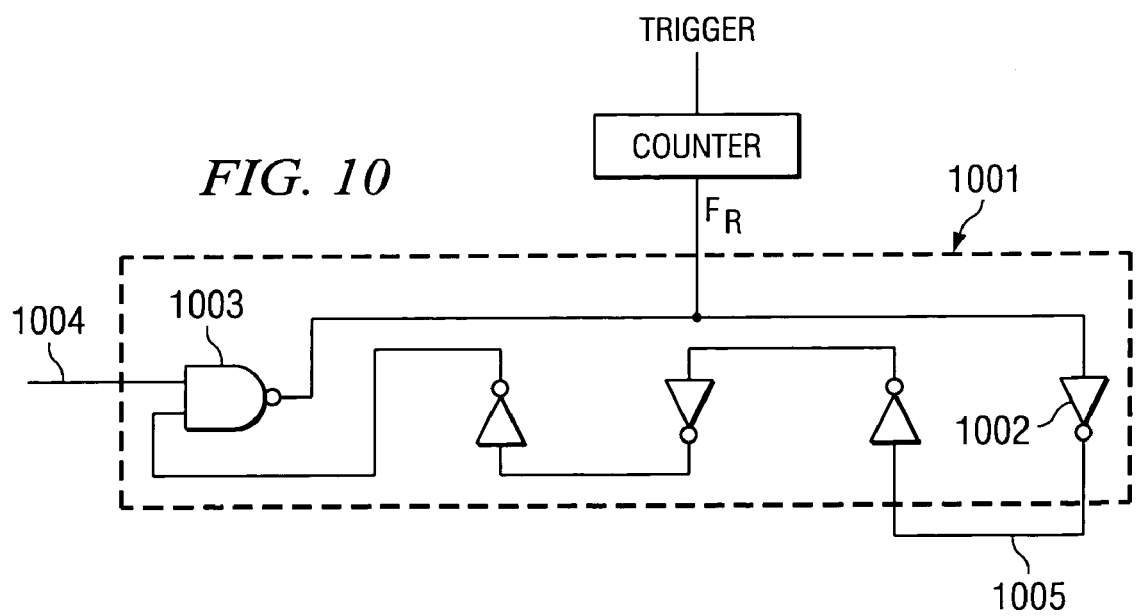
FIG. 10 is a schematic of a reference ring oscillator.

FIG. 10 shows a ring oscillator 1001 comprised of an even number of inverters 1002, and a nand gate 1003 interconnected as shown. This circuit, under the control of line 1004 will oscillate at a frequency $F_r$. This frequency will depend on the transistor characteristics and on the intra cell parasitics such as illustrated in FIGS. 5 and 7 are represented schematically as 1005. The frequency $F_r$ can be measured conventionally by a counter controlled by a trigger signal.

Figure 11:
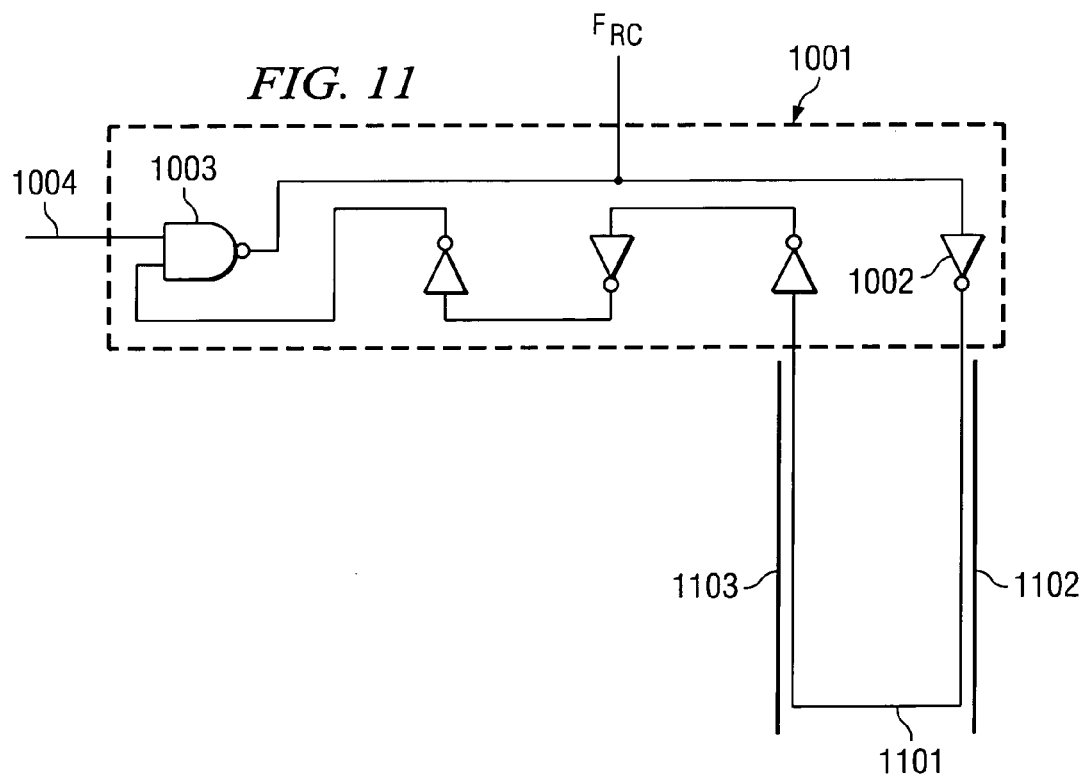
FIG. 11 shows a schematic of a reference ring oscillator employed in measuring the RC parasitics.

FIG. 11 shows the ring oscillator 1001 of drawing 10, but in this case the interconnect between two of the inverters is an external DUT structure 1101. This structure is surrounded by parallel conductors 1102 and 1103 which are connected to a dedicated ground. The frequency $F_{RC}$ of ring oscillator 1001 in this case is controlled by the transistor characteristics, the intra cell parasitics, and by the resistance (R) and capacitance (C) parasitics of the DUT structure 1101.

Figure 12:
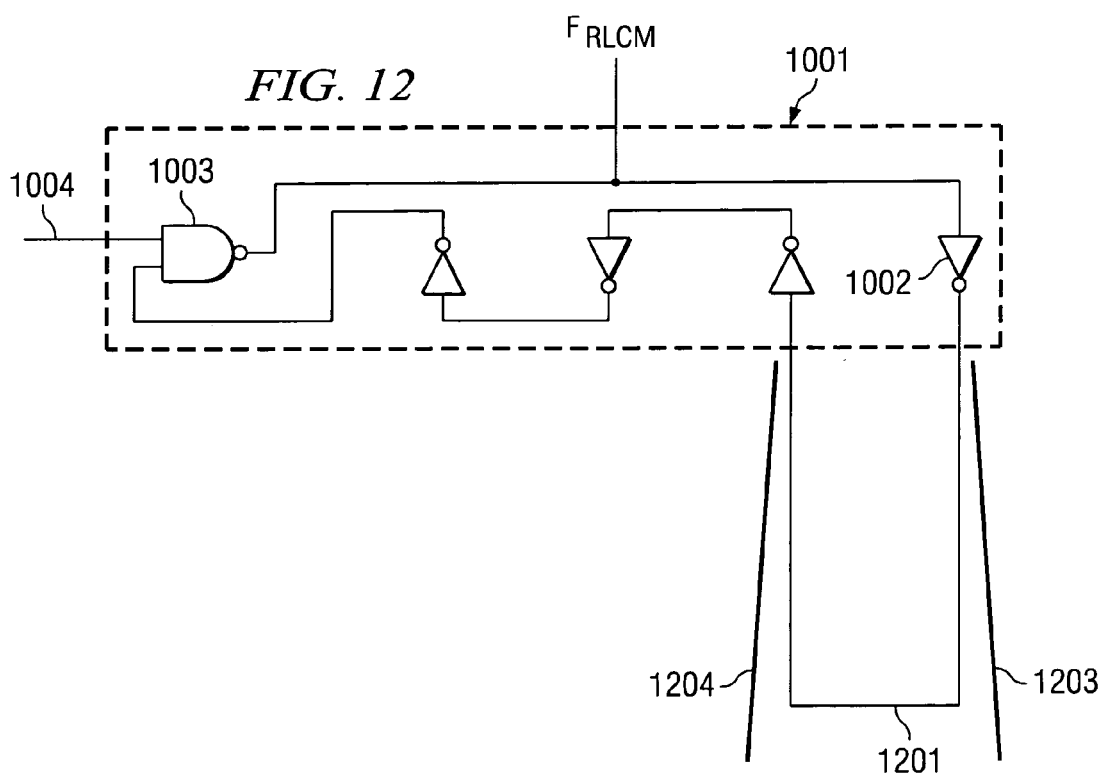
FIG. 12 is a schematic of a ring oscillator influenced by inductance parasitics.

FIG. 12 shows the ring oscillator 1001 of drawing 10. In this case, the DUT structure 1201 is surrounded by actual "aggressor" circuitry 1203 and 1204, and the frequency of oscillation FRLCM will be controlled by the transistor characteristics, the intra cell parasitics, the resistance (R), capacitance (C), self inductance (L), and the mutual inductance (M) parasitics of the DUT structure 1201.

Since the three ring oscillators let us eliminate the effects of transistor characteristics, intra cell parasitics and RC parasitics of the DUT, the inductance parasitics may be easily calculated.

As used herein, the terms "applied," "connected," and "connection" mean electrically connected, including where additional elements may be in the electrical connection path. "Associated" means a controlling relationship, such as a memory resource that is controlled by an associated port. The terms assert, assertion, de-assert, de-assertion, negate and negation are used to avoid confusion when dealing with a mixture of active high and active low signals. Assert and assertion are used to indicate that a signal is rendered active, or logically true. De-assert, de-assertion, negate, and negation are used to indicate that a signal is rendered inactive, or logically false.

While the invention has been described with reference to illustrative embodiments, this description is not intended to be construed in a limiting sense. Various other embodiments of the invention will be apparent to persons skilled in the art upon reference to this description. For example, in another embodiment, the non-overlapping clock signals are generated by a clock circuit within the test structure, rather than being supplied via a probe pad. In another embodiment, a single clock is provided via a probe pad that is then converted into two non-overlapping clock signals by a circuit included with the test structure.

Various types to DUT structures can be used; for example, active components such as transistors can be included in order to measure parasitic parameters of the transistors.

An operational circuit, such as a ring oscillator can be a DUT and an operation parameter such as frequency can be measured. The select signal can be used to bias a secondary structure proximate to the oscillator and a resulting frequency can be measured to determine sensitivity of the oscillator to the secondary structure.

In another embodiment, the select signal may be used to select more than two bias parameters by using a multi-bit select signal, or by encoding a select number using a pulse code or various signal levels, for example.

In another embodiment, one bias circuit may be used to bias all of the secondary structures in a given test structure. Alternatively, one selection circuit having multiple outputs may be connected to several different bias inverters so that a single select signal can cause different bias conditions to be placed on various secondary structures. In this case, the select signal may be a multi-bit select signal, or may be encoded by using a pulse code or various signal levels, for example.

In another embodiment, additional multiplexers or demultiplexers may be provided and used to select from multiple test structures according to an input signal in order to reduce the needed number of probe pads. When a particular DUT test structure is selected, that test structure is connected to the probe pads and its electrical characteristics are tested by further selecting various bias values to configure various effective structures, as described above.

Advantageously, the test methods described herein may be used for measuring capacitance of a variety of structures. For example, the method can be used to monitor memory bit-line and word-line capacitances. Alternatively, the method can be used to measure transistor intrinsic capacitance. Alternatively, the method can be used to separate out capacitances due to contacts and vias in integrated circuits. Many other types of structures may be measured using the methods described herein as is readily apparent to one skilled in the art of semiconductor circuit design and/or fabrication.

What is claimed is:

1. A partially fabricated wafer having a test structure overlying the substrate of the wafer, the test structure comprising:
   a first ring oscillator comprising an even number of inverters and a NAND gate having two inputs and an output, said inverters coupled in series having a first input connected to said output of said NAND gate and a final output connected to said first input of said NAND gate, whereby said first ring oscillator has a frequency of oscillation influenced by transistor characteristics and intra device parasitics;
   a second ring an oscillator comprising an even number of inverters, a NAND gate having two inputs and an output, a device under test (DUT) line and a passive conductor parallel to said DUT line, said inverters coupled in series having a first input connected to said output of said NAND gate and a final output connected to said first input of said NAND gate and said DUT line coupled between said output of an inverter and said input of a successive inverter, whereby said second ring oscillator has a frequency of oscillation being influenced by the transistor characteristics, intra device parasitics, resistive and capacitive parasitics of said DUT line relative to said passive conductor; and
   a third ring oscillator comprising an even number of inverters, a NAND gate having two inputs and an output, a device under test (DUT) line and an aggressor conductor parallel to said DUT line, said inverters coupled in series having a first input connected to said output of said NAND gate and a final output connected to said first input of said NAND gate and said DUT line coupled between said output of an inverter and said input of a successive inverter, whereby said third ring oscillator has a frequency of oscillation being influenced by the transistor characteristics, intra device parasitics, resistive, capacitive and inductive parasitics of said DUT line relative to said aggressor conductor.

2. The partially fabricated wafer of claim 1, wherein said first, second and third ring oscillators are located in a scribeline of the wafer.

3. A method for testing a partially fabricated wafer, comprising the steps of:
   providing a first ring oscillator comprising an even number of inverters and a NAND gate having two inputs and an output, said inverters coupled in series having a first input connected to said output of said NAND gate and a final output connected to said first input of said NAND gate;
   measuring a frequency of operation of the first ring oscillator;

providing a second ring an oscillator comprising an even number of inverters, a NAND gate having two inputs and an output, a device under test (DUT) line and a passive conductor parallel to said DUT line, said inverters coupled in series having a first input connected to said output of said NAND gate and a final output connected to said first input of said NAND gate and said DUT line coupled between said output of an inverter and said input of a successive inverter;

measuring a frequency of operation of the second ring oscillator while connecting the passive conductor to a fixed voltage;

providing a third ring oscillator comprising an even number of inverters, a NAND gate having two inputs and an output, a device under test (DUT) line and an aggressor conductor parallel to said DUT line, said inverters coupled in series having a first input connected to said output of said NAND gate and a final output connected to said first input of said NAND gate and said DUT line coupled between said output of an inverter and said input of a successive inverter; and measuring a frequency of operation of the third ring oscillator while connecting the aggressor conductor to a oscillating voltage.

\* \* \* \* \*